US011456414B2

(12) United States Patent
Kim et al.

(10) Patent No.: US 11,456,414 B2
(45) Date of Patent: Sep. 27, 2022

(54) VARIABLE RESISTANCE MEMORY DEVICE AND METHOD OF MANUFACTURING THE SAME

(71) Applicant: SAMSUNG ELECTRONICS CO., LTD., Suwon-si (KR)

(72) Inventors: Jonguk Kim, Yongin-si (KR); Young-Min Ko, Hwaseong-si (KR); Byongju Kim, Hwaseong-si (KR); Jaeho Jung, Seoul (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 16/416,472

(22) Filed: May 20, 2019

(65) Prior Publication Data
US 2020/0111954 A1    Apr. 9, 2020

(30) Foreign Application Priority Data

Oct. 4, 2018 (KR) .................. 10-2018-0118205

(51) Int. Cl.
*H01L 27/24* (2006.01)
*H01L 45/00* (2006.01)

(52) U.S. Cl.
CPC ........ *H01L 45/124* (2013.01); *H01L 27/2427* (2013.01); *H01L 27/2463* (2013.01); *H01L 45/06* (2013.01); *H01L 45/08* (2013.01); *H01L 45/16* (2013.01)

(58) Field of Classification Search
CPC . H01L 27/2427; H01L 27/2463; H01L 45/08; H01L 45/16; H01L 45/124
See application file for complete search history.

(56) References Cited

U.S. PATENT DOCUMENTS

| 6,287,951 | B1 * | 9/2001 | Lucas ............... H01L 21/76801 |
| | | | 257/E21.507 |
| 9,397,143 | B2 | 7/2016 | Rocklein et al. |
| 9,515,250 | B2 | 12/2016 | Ha |
| 9,660,178 | B2 | 5/2017 | Kim |
| 9,761,797 | B2 | 9/2017 | Kim et al. |
| 9,780,144 | B2 | 10/2017 | Seong et al. |
| 10,128,437 | B1 * | 11/2018 | Fantini ................ H01L 45/1608 |
| 2015/0287916 | A1 | 10/2015 | Campbell et al. |
| 2017/0092847 | A1 * | 3/2017 | Kim ........................ H01L 43/12 |
| 2017/0170237 | A1 | 6/2017 | Jung |
| 2017/0364306 | A1 * | 12/2017 | Kim ....................... G06F 3/0685 |

FOREIGN PATENT DOCUMENTS

KR    10-2017-0069893 A    6/2017

* cited by examiner

Primary Examiner — Trang Q Tran
(74) Attorney, Agent, or Firm — Sughrue Mion, PLLC

(57) ABSTRACT

A method of manufacturing a variable resistance memory device may include: forming a memory cell including a variable resistance pattern on a substrate; performing a first process to deposit a first protective layer covering the memory cell; and performing a second process to deposit a second protective layer on the first protective layer. The first process and the second process may use the same source material and the same nitrogen reaction material, and a nitrogen content in the first protective layer may be less than a nitrogen content in the second protective layer.

12 Claims, 22 Drawing Sheets

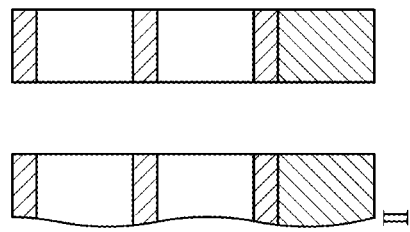
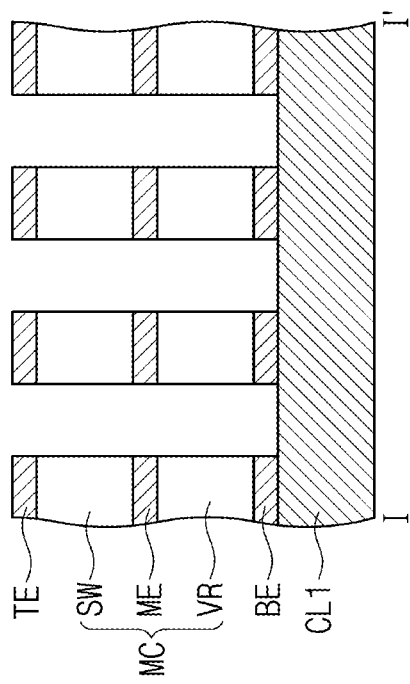

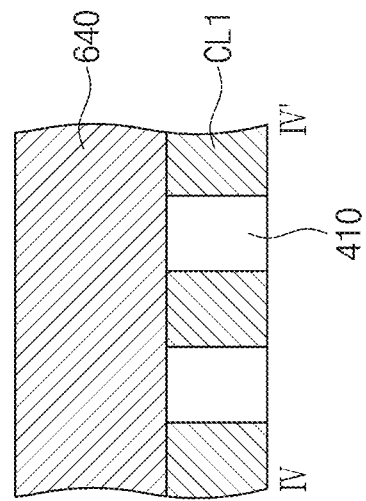
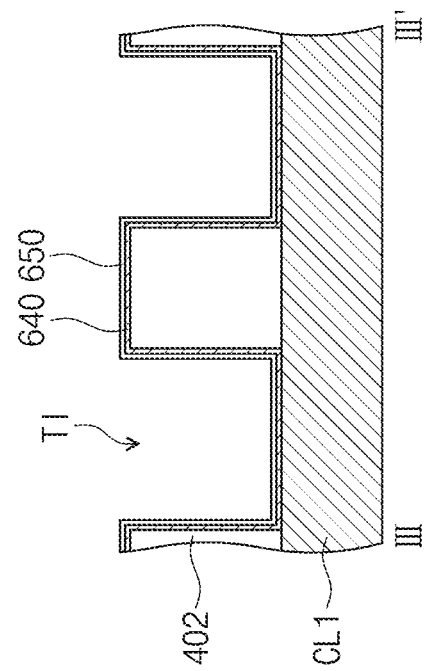

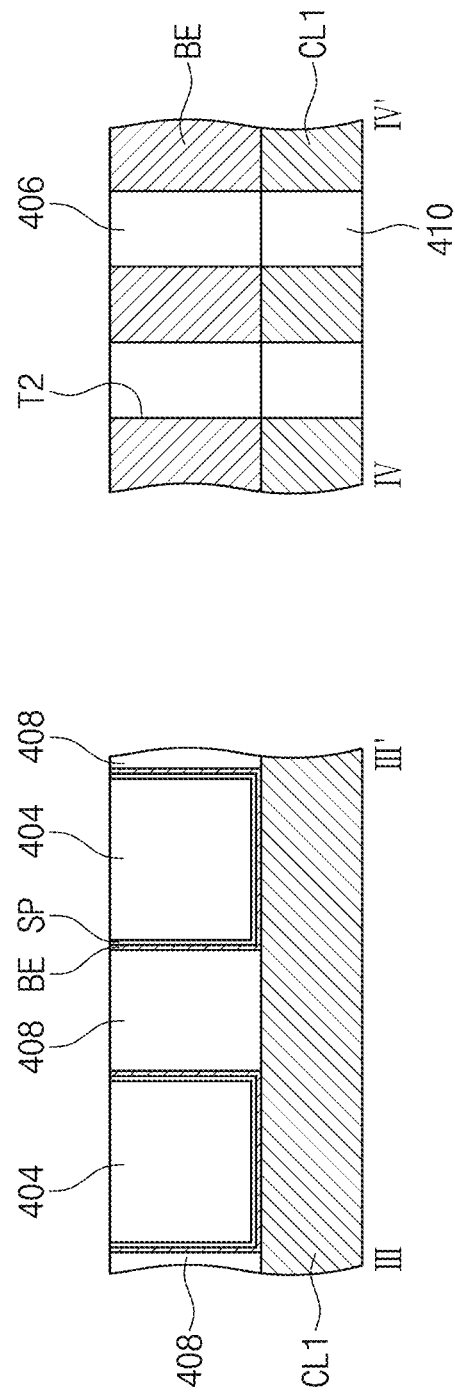

VARIABLE RESISTANCE MEMORY DEVICE AND METHOD OF MANUFACTURING THE SAME

CROSS-REFERENCE TO THE RELATED APPLICATION

This application claims priority from Korean Patent Application No. 10-2018-0118205, filed on Oct. 4, 2018, in the Korean Intellectual Property Office, the disclosure of which is incorporated herein by reference in its entirety.

BACKGROUND

Embodiments of the inventive concepts relate to a variable resistance memory device and a method of manufacturing the same.

Semiconductor devices may be categorized as any one of memory devices and logic devices. The memory devices may store logical data. Generally, semiconductor memory devices may be classified into volatile memory devices and non-volatile memory devices. The volatile memory devices may lose their stored data when their power supplies are interrupted, but the non-volatile memory devices may retain their stored data even when their power supplies are interrupted.

Next-generation semiconductor memory devices such as ferroelectric random-access memory (FRAM) devices, magnetic random-access memory (MRAM) devices, and phase-change random access memory (PRAM) devices have been developed to provide high-performance and low power consuming semiconductor memory devices. Materials of these next-generation semiconductor memory devices may have resistance values variable according to currents or voltages applied thereto, and may retain their resistance values even when currents or voltages are interrupted.

SUMMARY

Various embodiments of the inventive concepts may provide a variable resistance memory device with improved stability and a method of manufacturing the same.

According to an aspect of example embodiments, there is provided a method of manufacturing a variable resistance memory device which may include: forming a memory cell including a variable resistance pattern on a substrate; performing a first process to deposit a first protective layer covering the memory cell; and performing a second process to deposit a second protective layer covering the first protective layer. The first process and the second process may use the same source material and the same nitrogen reaction material, and a nitrogen content in the first protective layer may be less than a nitrogen content in the second protective layer.

According to an aspect of example embodiments, there is provided a variable resistance memory device which may include: a variable resistance pattern provide on a substrate; a first nitride layer covering at least a portion of the variable resistance pattern; and a second nitride layer formed on the first nitride layer. A nitrogen content in the first nitride layer may be less than a nitrogen content in the second nitride layer.

According to an aspect of example embodiments, there is provided a method of manufacturing a variable resistance memory device which may include: forming a memory cell including a variable resistance pattern on a substrate, and performing a deposition process to deposit a nitride layer covering the memory cell on the substrate. The performing the deposition process may include providing a source material and a nitrogen reaction material on the memory cell, and reacting the nitrogen reaction material with the source material. An amount of the provided nitrogen reaction material may increase in the deposition process as the deposition of the nitride layer proceeds.

According to an aspect of example embodiments, there is provided a variable resistance memory device which may include: a first conductive line provided on a substrate, a second conductive line intersecting the first conductive line on the first conductive line, a memory cell including a variable resistance pattern and provided at an intersection point of the first conductive line and the second conductive line, and a protective layer sealing the memory cell on the substrate and including silicon nitride ($SiN_x$). A nitrogen content in the protective layer increases as a distance from an interface between the protective layer and the memory cell increases.

BRIEF DESCRIPTION OF THE DRAWINGS

The inventive concepts will become more apparent in view of the attached drawings and accompanying detailed description.

FIGS. 5A-5B to 8A-8B are cross-sectional views illustrating a method of manufacturing a variable resistance memory device according to some embodiments.

FIGS. 12A-12B to 19A-19B are cross-sectional views illustrating a method of manufacturing a variable resistance memory device according to some embodiments.

DETAILED DESCRIPTION OF THE EMBODIMENTS

The embodiments described herebelow are all exemplary, and thus, the inventive concepts are not limited to these embodiments disclosed below, and may be realized in various other forms of embodiment.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Variable resistance memory devices according to embodiments of the inventive concepts will be described hereinafter with reference to the drawings.

Figure 1:
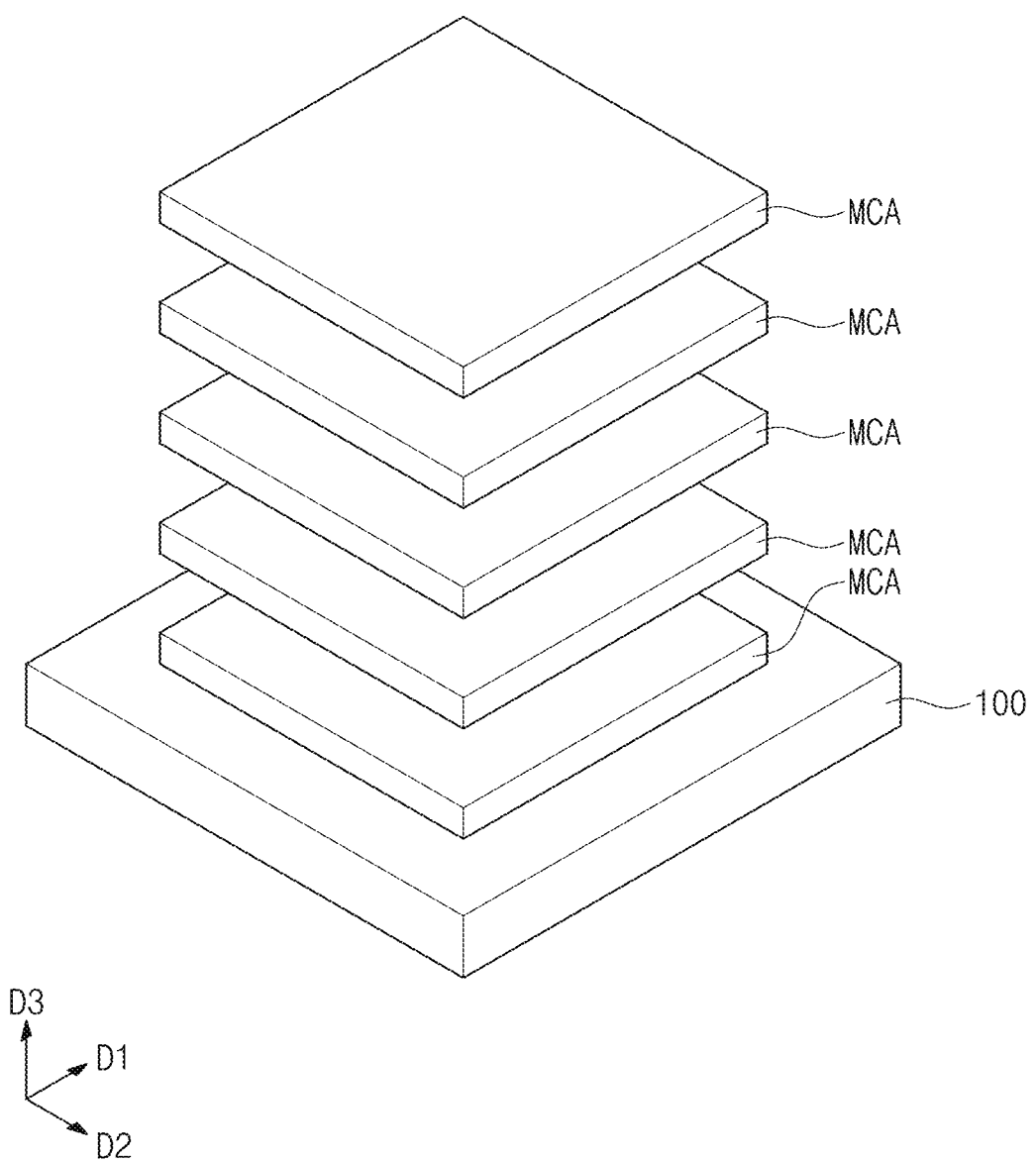
FIG. 1 is a conceptual view illustrating a variable resistance memory device according to some embodiments.

FIG. 1 is a conceptual view illustrating a variable resistance memory device according to some embodiments.

Referring to FIG. 1, a variable resistance memory device may include a plurality of memory cell stacks MCA sequentially stacked on a substrate 100. Each of the memory cell stacks MCA may include a plurality of memory cells two-dimensionally, but not necessarily, arranged. The variable resistance memory device may also include conductive lines which are disposed between the memory cell stacks MCA and are used for write, read and/or erase operation of the memory cells. FIG. 1 illustrates five memory cell stacks MCA. However, embodiments of the inventive concepts are not limited thereto.

Figure 2:
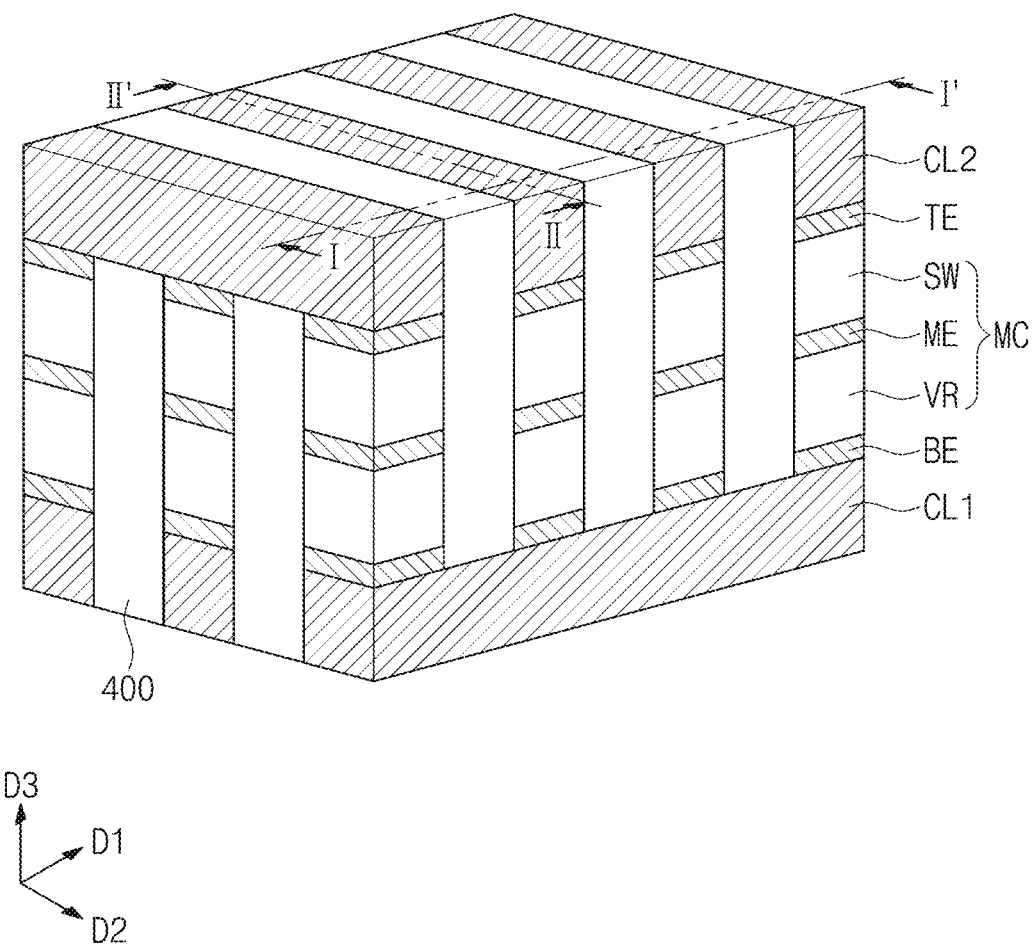
FIG. 2 is a perspective view schematically illustrating a portion of a variable resistance memory device according to some embodiments.
Figure 3B:
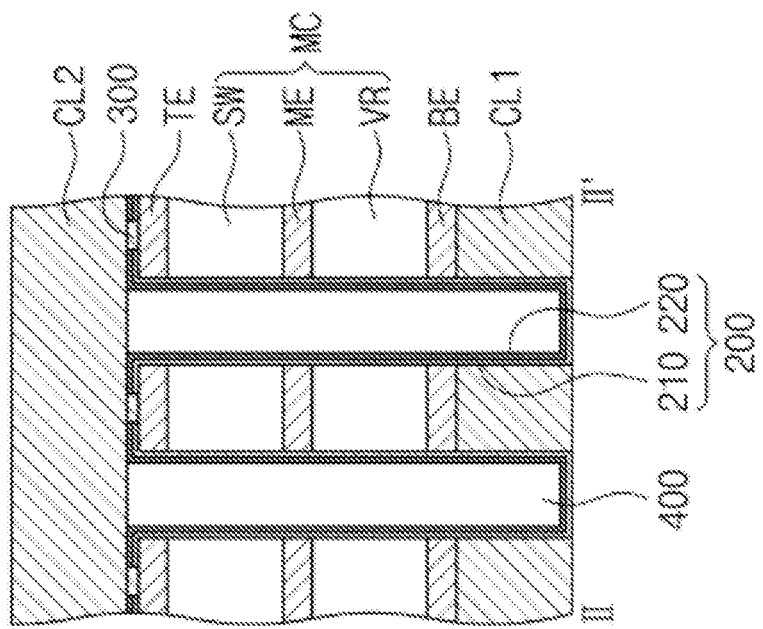
FIGS. 3A-3B are cross-sectionals views taken along lines I-I' and II-II' of FIG. 2, respectively.
Figure 3A:
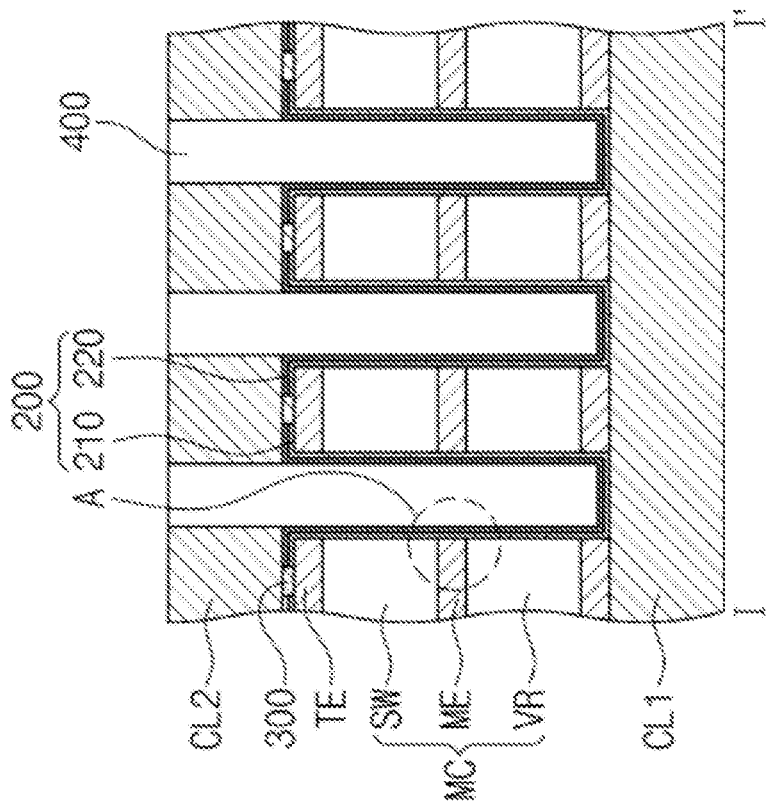

FIG. 2 is a perspective view schematically illustrating a portion of a variable resistance memory device according to some embodiments. FIGS. 3A-3B are cross-sectional views taken along lines I-I' and II-II' of FIG. 2, respectively. Some components are omitted in FIGS. 2 and 3A-3B for the purpose of ease and convenience in explanation and illustration.

Referring to FIGS. 2 and 3A-3B, first conductive lines CL1 and second conductive lines CL2 may be provided on a substrate (not shown, see 100 of FIG. 1). The first conductive lines CL1 may extend in a first direction D1 and may be spaced apart from each other in a second direction D2. The first conductive lines CL1 may be word lines. The second conductive lines CL2 may be spaced apart from the first conductive lines CL1 in a third direction D3 perpendicular to the first and second directions D1 and D2. The second conductive lines CL2 may extend in the second direction D2 and may be spaced apart from each other in the first direction D1. The second conductive lines CL2 may be bit lines. The first conductive lines CL1 and the second conductive lines CL2 may include a metal (e.g., copper, tungsten, or aluminum) and/or a metal nitride (e.g., tantalum nitride, titanium nitride, or tungsten nitride).

The memory cell stack MCA may be provided between the first conductive lines CL1 and the second conductive lines CL2. The memory cell stack MCA may include memory cells MC that are provided at intersection points of the first conductive lines CL1 and the second conductive lines CL2, respectively. The memory cells MC may be two-dimensionally, but not necessarily, arranged in the first direction D1 and the second direction D2. One memory cell stack MCA is illustrated for the purpose of ease and convenience in explanation and illustration. However, in certain embodiments, a plurality of the memory cell stacks MCA may be stacked on the substrate (not shown) in the third direction D3. In this case, structures corresponding to the memory cell stack MCA and the first and second conductive lines CL1 and CL2 may be repeatedly stacked on the substrate (not shown).

Each of the memory cells MC may include a variable resistance pattern VR, an intermediate electrode ME, and a switching pattern SW. The variable resistance pattern VR, the intermediate electrode ME and the switching pattern SW included in each of the memory cells MC may be connected in series between a corresponding one of the first conductive lines CL1 and a corresponding one of the second conductive lines CL2. In FIGS. 2 and 3A-3B, the switching pattern SW is disposed on the variable resistance pattern VR. However, embodiments of the inventive concepts are not limited thereto. In certain embodiments, the variable resistance pattern VR may be disposed on the switching pattern SW, unlike FIGS. 2 and 3A-3B.

The variable resistance pattern VR may be formed of a material capable of storing information (or data). In some embodiments, the variable resistance pattern VR may include a material of which a phase is reversibly changeable between a crystalline state and an amorphous state by temperature. For example, a phase transition temperature between the crystalline and amorphous states of the variable resistance pattern VR may range from about 250 degrees Celsius to about 350 degrees Celsius. In these embodiments, the variable resistance pattern VR may include a compound that includes at least one of tellurium (Te) and selenium (Se) (i.e., chalcogen elements) and at least one of germanium (Ge), antimony (Sb), bismuth (Bi), lead (Pb), tin (Sn), silver (Ag), arsenic (As), sulfur (S), silicon (Si), indium (In), titanium (Ti), gallium (Ga), phosphorus (P), oxygen (O), and carbon (C). For example, the variable resistance pattern VR may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. For another example, the variable resistance pattern VR may have a superlattice structure in which layers including germanium (Ge) and layers not including germanium (Ge) are alternately and repeatedly stacked (e.g., a structure in which GeTe layers and SbTe layers are alternately and repeatedly stacked).

Alternatively, in certain embodiments, the variable resistance pattern VR may include at least one of perovskite compounds and conductive metal oxides. For example, the variable resistance pattern VR may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, and barium-strontium-zirconium oxide. For other examples, the variable resistance pattern VR may have a double-layer structure of a conductive metal oxide layer and a tunnel insulating layer or may have a triple-layer structure of a first conductive metal oxide layer, a tunnel insulating layer and a second conductive metal oxide layer. In this case, the tunnel insulating layer may include aluminum oxide, hafnium oxide, or silicon oxide.

The switching pattern SW may be an element based on a threshold switching phenomenon having a nonlinear I-V curve (e.g., an S-shaped I-V curve). For example, the switching pattern SW may be an ovonic threshold switch (OTS) element having a bi-directional characteristic. The switching pattern SW may have a phase transition temperature between a crystalline state and an amorphous state, which is higher than that of the variable resistance pattern VR. For example, the phase transition temperature of the switching pattern SW may range from about 350 degrees Celsius to about 450 degrees Celsius. Thus, when the variable resistance memory device according to the embodiments is operated, a phase of the variable resistance pattern VR may be reversibly changeable between a crystalline state and an amorphous state, but the switching pattern SW may be maintained in a substantially amorphous state without a phase change. In the present specification, the term 'substantially amorphous state' may include an amorphous state, and may also include a case in which a grain boundary or a crystallized portion locally exists in a portion of a component. The switching pattern SW may be formed of a compound that includes at least one of tellurium (Te) and selenium (Se) (i.e., chalcogenide-based elements) and at least one of germanium (Ge), antimony (Sb), bismuth (Bi), aluminum (Al), lead (Pb), tin (Sn), silver (Ag), arsenic (As), sulfur (S), silicon (Si), indium (In), titanium (Ti), gallium (Ga), and phosphorus (P). The switching pattern SW may further include a thermal stabilization element. The thermal stabilization element may include at least one of carbon (C), nitrogen (N), and oxygen (O). For example, the switching pattern SW may include AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

The variable resistance pattern VR and the switching pattern SW may be electrically connected to each other through the intermediate electrode ME disposed therebetween. The intermediate electrode ME may include tungsten (W), titanium (Ti), aluminum (Al), copper (Cu), carbon (C), and/or carbon nitride (CN).

The memory cells MC may be electrically connected to the first conductive lines CL1 and the second conductive lines CL2 through bottom electrodes BE and top electrodes TE, respectively. For example, each of the bottom electrodes BE may be disposed between a corresponding one of the first conductive lines CL1 and a corresponding one of the memory cells MC to electrically connect them. Each of the top electrodes TE may be disposed between a corresponding one of the memory cells MC and a corresponding one of the second conductive lines CL2 to electrically connect them. The bottom electrodes BE and the top electrodes TE may include tungsten (W), titanium (Ti), aluminum (Al), copper (Cu), carbon (C), and/or carbon nitride (CN).

Even though not shown in the drawings, a resistivity adjustment pattern (not shown) may be disposed between the intermediate electrode ME and the variable resistance pattern VR or between the variable resistance pattern VR and the bottom electrode BE. The resistivity adjustment pattern (not shown) may be in contact with a bottom surface of the variable resistance pattern VR or a top surface of the variable resistance pattern VR. The resistivity adjustment pattern may include titanium silicide nitride (TiSiN), tungsten (W), titanium (Ti), cobalt (Co), or titanium nitride (TiN). The resistivity adjustment pattern (not shown) may heat the variable resistance pattern VR to change a phase of the variable resistance pattern VR. The phase of a portion of the variable resistance pattern VR may be changed to perform a reset operation.

A protective layer 200 may be provided on the memory cells MC. The protective layer 200 may be formed on the memory cells MC on the first conductive line CL1. For example, the protective layer 200 may be provided along sidewalls of the memory cells MC to surround the sidewalls of the memory cells MC. The protective layer 200 may be in contact with the sidewalls of the memory cells MC. In FIG. 3A-3B, the protective layer 200 extends from the sidewalls of the memory cells MC into between the top electrodes TE and the second conductive lines CL2. However, embodiments are not limited thereto. The protective layer 200 may extend between the second conductive lines CL2 and top surfaces of the memory cells MC (i.e., top surfaces of the switching patterns SW) or may not be provided on the top surfaces of the memory cells MC. Hereinafter, the protective layer 200 extending between the top electrodes TE and the second conductive lines CL2 will be described as an example. The protective layer 200 may be formed on top surfaces of the first conductive lines CL1 as needed. The protective layer 200 may include a nitride layer such as silicon nitride ($SiN_x$). For example, the protective layer 200 may include undoped silicon nitride (undoped-$SiN_x$).

According to some embodiments, nitrogen contents may be different from each other at different positions in the protective layer 200. The nitrogen content in the protective layer 200 (e.g., "x" in silicon nitride ($SiN_x$)) may be low near at an interface between the protective layer 200 and the memory cell MC, and may be high near at an outer sidewall of the protective layer 200. Here, the outer sidewall of the protective layer 200 may be defined as a sidewall opposite to the interface between the protective layer 200 and the memory cell MC. A density of silicon nitride ($SiN_x$) may be varied depending on the nitrogen content thereof. For example, the density of silicon nitride ($SiN_x$) may increase as the nitrogen content thereof increases. Thus, a density of the protective layer 200 may be the lowest near the interface between the protective layer 200 and the memory cell MC, and may be the highest at the outer sidewall of the protective layer 200. The nitrogen content of the protective layer 200 may be low near the memory cells MC, and thus, it is possible to minimize or prevent damage (e.g., nitrification reaction) of the memory cells MC by nitrogen. In addition, the density of an outer surface of the protective layer 200 may be high by the high nitrogen content, and thus, the protective layer 200 may prevent the memory cells MC from being damaged by permeation of external oxygen or moisture, and may protect the memory cells MC from an external impact. Hereinafter, the protective layer 200 will be described in more detail.

Figure 4A:
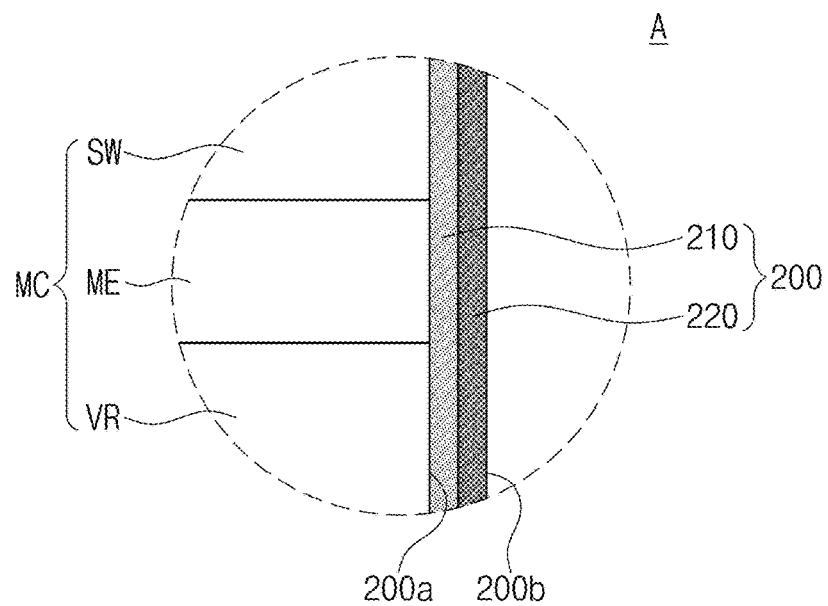
FIGS. 4A and 4B are enlarged views of a region 'A' of FIG. 3.
Figure 4B:
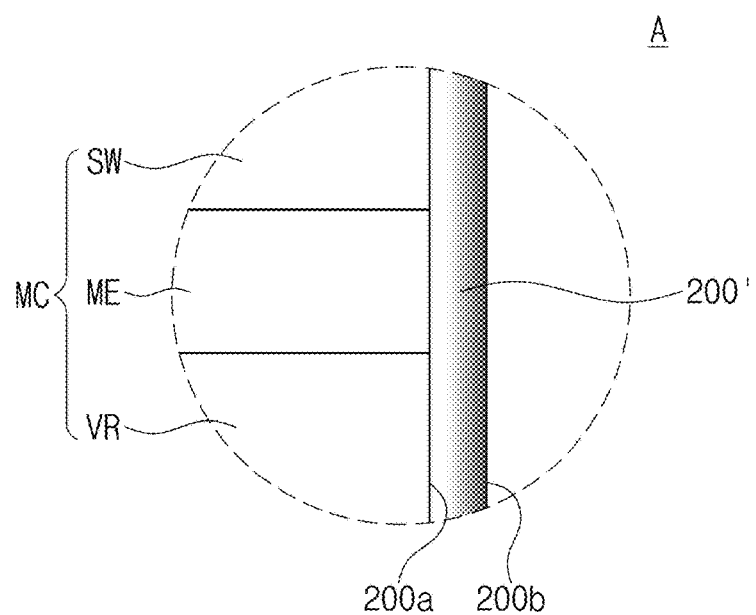
Figure 6A:
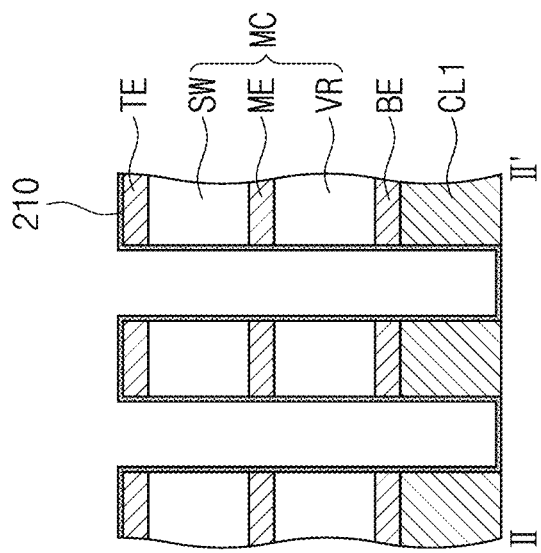
Figure 6B:
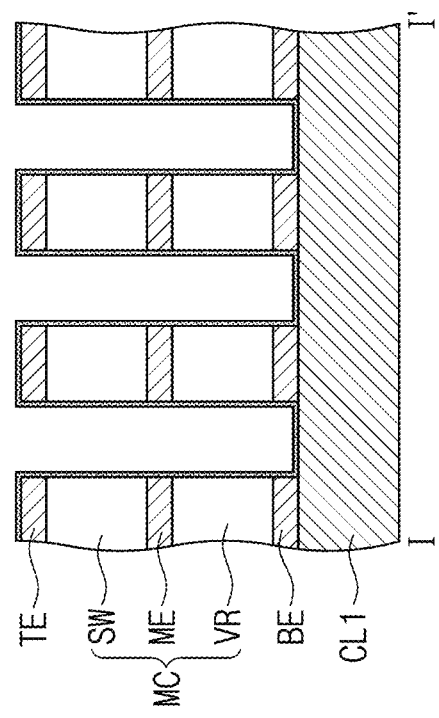
Figure 7A:
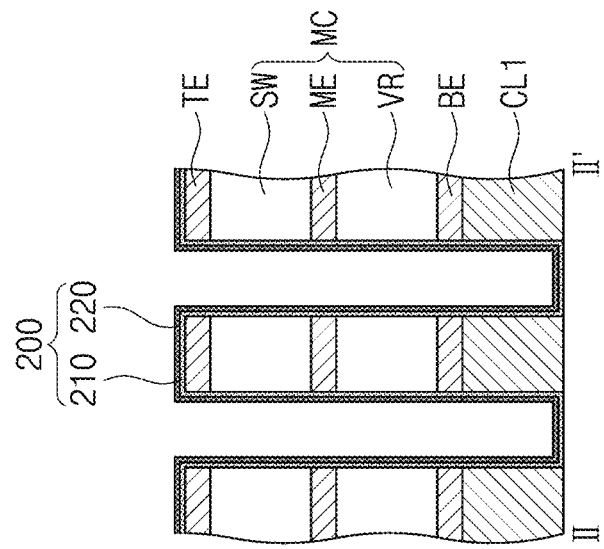
Figure 7B:
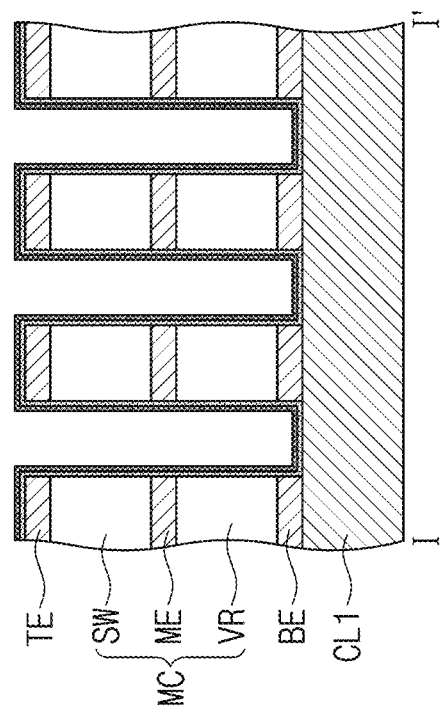

FIGS. 4A and 4B are enlarged views of a region 'A' of FIG. 3A.

In some embodiments, the protective layer 200 may include nitride layers having different nitrogen contents. Referring to FIG. 4A, the protective layer 200 may include a first protective layer 210 being in contact with the sidewall of the memory cell MC (e.g., an interface 200a between the protective layer 200 and the memory cell MC), and a second protective layer 220 formed on the first protective layer 210. The second protective layer 220 may be spaced apart from the memory cell MC by the first protective layer 210. The first protective layer 210 and the second protective layer 220 may include the same material. For example, the first protective layer 210 and the second protective layer 220 may include silicon nitride (SiNx). Here, a nitrogen content of the first protective layer 210 may be less than a nitrogen content of the second protective layer 220. For example, the nitrogen content of the second protective layer 220 may range from 110% to 200% of the nitrogen content of the first protective layer 210. A density of the first protective layer 210 may be less than a density of the second protective layer 220. For example, the density of the second protective layer 220 may range from 110% to 150% of the density of the first protective layer 210. As described above, the protective layer 200 may include the first protective layer 210 minimizing or preventing damage of the memory cells MC by nitrogen, and the second protective layer 220 minimizing or preventing damage of the memory cells MC by an external factor (e.g., oxygen or moisture). Here, the first protective layer 210 and the second protective layer 220 may be continuous components, and an interface between the first and second protective layers 210 and 220 may not be visible. Alternatively, the interface between the first and second protective layers 210 and 220 may be visible.

Alternatively, in certain embodiments, a nitrogen content of a protective layer 200' may increase as a distance from the sidewall of the memory cell MC increases. Referring to FIG. 4B, the protective layer 200' may include silicon nitride (SiN$_x$). The nitrogen content in the protective layer 200' may be the lowest near an interface 200a between the protective layer 200' and the memory cell MC, and may be the highest at an outer sidewall 200b of the protective layer 200'. Here, the nitrogen content in the protective layer 200' may gradually increase from the interface 200a between the protective layer 200' and the memory cell MC to the outer sidewall 200b of the protective layer 200'. A density of the protective layer 200' may increase from the interface 200a between the protective layer 200' and the memory cell MC to the outer sidewall 200b of the protective layer 200'.

Referring again to FIGS. 2 and 3A-3B, an insulating layer 400 may be provided on the substrate (not shown). The insulating layer 400 may fill a space between the memory cells MC. The insulating layer 400 may support the sidewalls of the memory cells MC. For example, the insulating layer 400 may include silicon oxide or silicon nitride.

Contacts 300 may be provided on the memory cells MC. The contacts 300 may penetrate the protective layer 200 in the third direction D3 so as to be in contact with the top electrodes TE on the memory cells MC. Each of the contacts 300 may be disposed between a corresponding one of the memory cells MC and a corresponding one of the second conductive lines CL2 to electrically connect the top electrode TE and the second conductive line CL2.

Figure 9A:
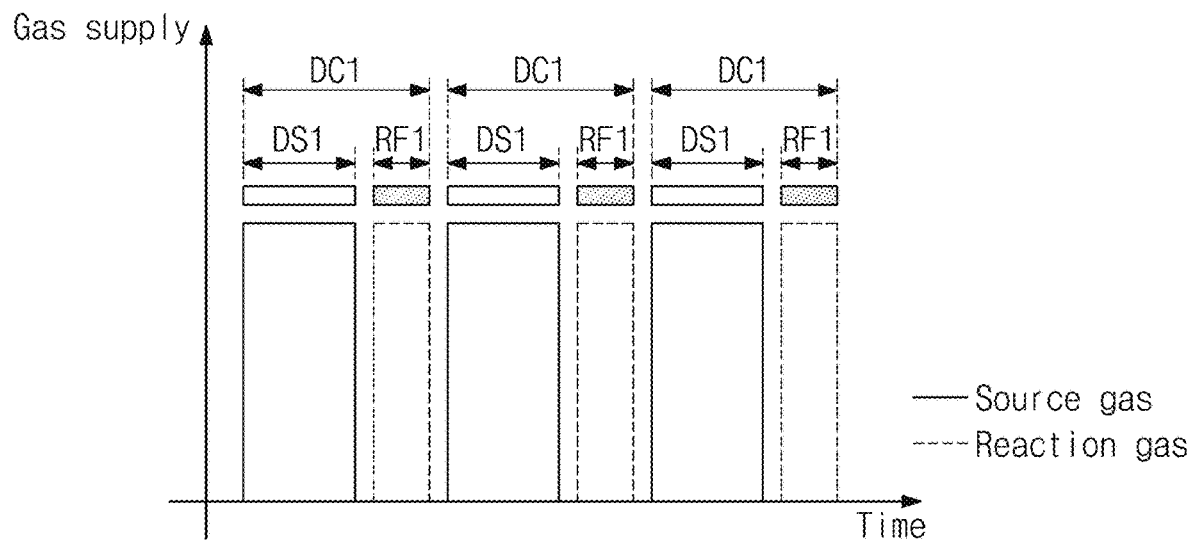
FIGS. 9A to 9C are diagrams illustrating a method of forming a first protective layer and a second protective layer according to some embodiments.
Figure 9B:
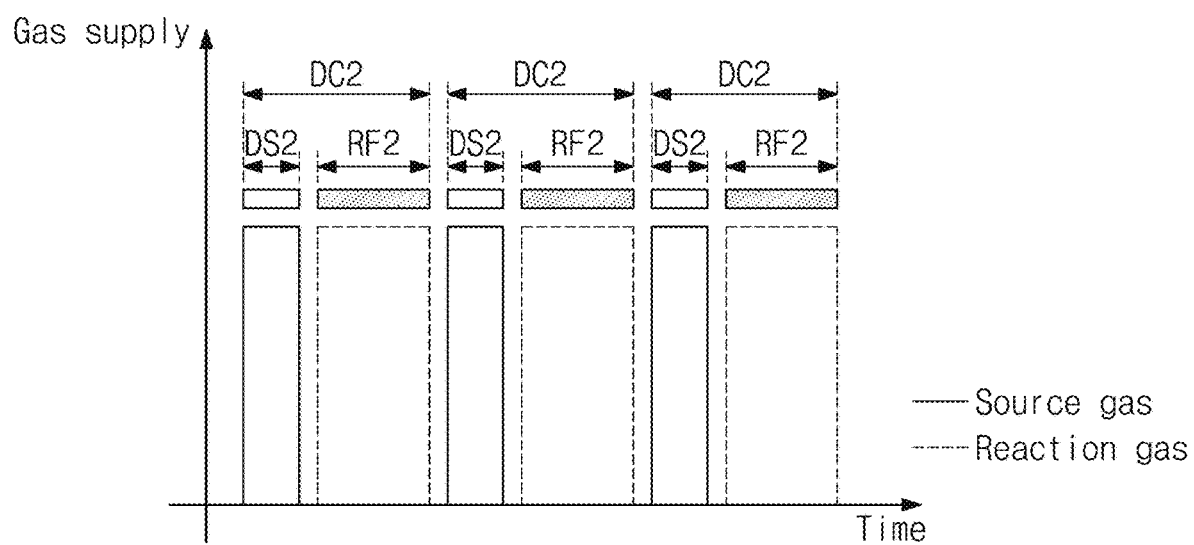
Figure 9C:
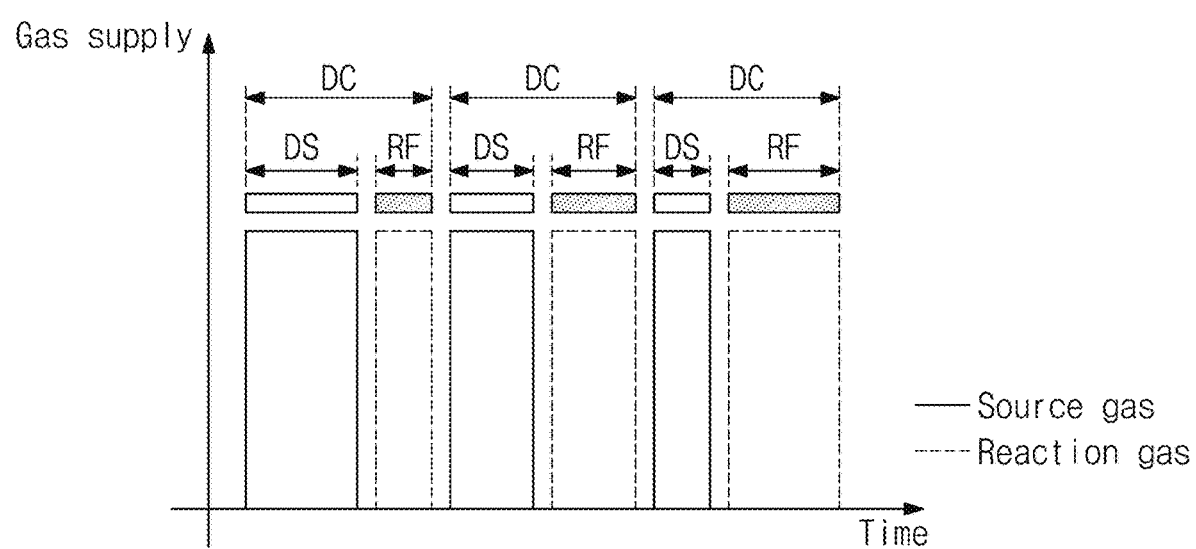

FIGS. 5A-5B to 7A-7B are cross-sectional views corresponding to the lines I-I' and II-II' of FIG. 2, respectively, to illustrate a method of manufacturing a variable resistance memory device according to some embodiments. FIGS. 9A to 9C are diagrams illustrating a method of forming a first protective layer and a second protective layer according to some embodiments.

Referring to FIGS. 2, 3A-3B and 5A-5B, first conductive lines CL1 and memory cells MC may be formed on a substrate (not shown). For example, a first conductive layer, a first electrode layer, a variable resistance layer, a second electrode layer, a switching layer and a third electrode layer may be sequentially stacked on the substrate, and then, a first patterning process of patterning them in a first direction may be performed. In the first patterning process, the first conductive layer may be etched to form the first conductive lines CL1. Subsequently, a second patterning process may be performed to pattern the first electrode layer, the variable resistance layer, the second electrode layer, the switching layer, and the third electrode layer in a second direction. The first electrode layer, the variable resistance layer, the second electrode layer, the switching layer, and the third electrode layer may be etched by the second patterning process to form bottom electrodes BE, variable resistance patterns VR, intermediate electrodes ME, switching patterns SW, and top electrodes TE. One variable resistance pattern VR, one intermediate electrode ME and one switching pattern SW which are sequentially stacked may constitute one memory cell MC. As illustrated in FIG. 2, the memory cells MC may be arranged in the first direction D1 and the second direction D2. An example of the method of forming the first conductive lines CL1 and the memory cells MC is described with reference to FIGS. 5A-5B. However, embodiments of the inventive concepts are not limited thereto.

Thereafter, a protective layer 200 may be formed on the memory cells MC. The embodiment of FIG. 4A in which the protective layer 200 includes the first protective layer 210 and the second protective layer 220 will be described hereinafter.

Referring to FIGS. 2, 3A-3B and 6A-6B, a first process may be performed to form a first protective layer 210. In some embodiments, the first process may be performed by an atomic layer deposition (ALD) method using a gas (i.e., a source gas) of a source material and a gas (i.e., a reaction gas) of a reaction material. The source gas may include silicon (Si) atoms, and the reaction gas may include nitrogen (N) atoms. For example, the reaction gas may include a nitrogen (N$_2$) gas, an ammonia (NH$_3$) gas, or reactive nitrogen.

The first process of depositing the first protective layer 210 may include at least one first deposition-cycle. A thickness of the first protective layer 210 may be adjusted by the number of the first deposition-cycle(s). In the first process, the first deposition-cycle may be repeatedly performed 10 times to 500 times, and the first deposition-cycle may be repeatedly performed under the same condition.

A form of each of the first deposition-cycles will be described. The first deposition-cycle may include a first dose process, a first RF process, and a purging process. In detail, the source gas may be supplied into a process chamber in which the substrate (not shown) is loaded, thereby performing the first dose process of adsorbing the source gas on surfaces of the memory cells MC. The adsorbed source gas may form a source material layer on the surfaces of the memory cells MC. A non-adsorbed source gas may be purged. Subsequently, the reaction gas may be supplied into the process chamber to perform the first RF process of reacting the reaction gas with the source material layer. For example, nitrogen plasma may be formed by radio-frequency (RF) power applied to the reaction gas, and the nitrogen plasma may react with the adsorbed source gas. Thereafter, a reaction byproduct and/or an unreacted reaction gas may be purged. A purging gas used in the purging process may be an inert gas (e.g., an argon (Ar) gas). The first protective layer 210 may be formed as described above.

A nitrogen content in the first protective layer 210 may be adjusted by adjusting a process time period of the first dose process and a process time period of the first RF process in the first deposition-cycle. Hereinafter, the term "process time duration" is referred to as "process time" for brevity. Referring to FIG. 9A, a process condition may be set such that the process time of the first dose process DS1 is longer than the process time of the first RF process RF1 in each of the first deposition-cycles DC1. The process time of the first dose process DS1 may range from 150% to 500% of the process time of the first RF process RF1. For example, the first dose process DS1 may be performed for about 6 seconds, and then, the first RF process RF1 may be performed for about 2 seconds. In this case, the amount of the source gas adsorbed on the surfaces of the memory cells MC may increase, and the amount of the reaction gas reacting with the adsorbed source gas may be reduced. Thus, the first protective layer 210 may be formed of a nitride layer having a low nitrogen content. In FIG. 9A, the first deposition-cycles DC1 repeatedly performed are performed for the same process time. However, embodiments of the inventive concepts are not limited thereto. In certain embodiments, the first deposition-cycles DC1 may be performed for different process times, and in this case, a ratio of the process time of the first RF process RF1 to the process time of the first dose process DS1 in each of the first deposition-cycles DC1 may be constant. Thus, the first protective layer 210 formed by the first process may have a constant nitrogen content.

Alternatively, the nitrogen content in the first protective layer 210 may be adjusted by adjusting the RF power used in the first RF process. For example, a process condition may be set such that the RF power used in the first RF process is low. In this case, the amount of the nitrogen plasma formed by the RF power applied to the reaction gas may be reduced, and thus, the amount of the reaction gas reacting with the adsorbed source gas may be reduced.

According to some embodiments, the first protective layer 210 being in contact with the memory cells MC may be formed to have the low nitrogen content. Thus, it is possible to inhibit the memory cells MC from being nitrified by nitrogen of the first protective layer 210. In addition, the amount (or a reaction time) of the nitrogen plasma used in the first RF process of forming the first protective layer 210 may be reduced, and thus, it is possible to inhibit the memory cells MC from being damaged by the nitrogen plasma during the first RF process.

Referring to FIGS. 2, 3A-3B and 7A-7B, a second process may be performed to form a second protective layer 220. In some embodiments, the second process may be performed by an ALD method using the same source gas and the same reaction gas as the first process. The source gas may include silicon (Si) atoms, and the reaction gas may include nitrogen (N) atoms.

The second process of depositing the second protective layer 220 may include at least one second deposition-cycle. A thickness of the second protective layer 220 may be adjusted by the number of the second deposition-cycle(s). In the second process, the second deposition-cycle may be repeatedly performed 10 times to 500 times, and the second deposition-cycle may be repeatedly performed under the same condition.

The second deposition-cycle may include a second dose process, a second RF process, and a purging process. In detail, the source gas may be supplied into the process chamber to perform the second dose process of adsorbing the source gas on a surface of the first protective layer 210. The adsorbed source gas may form a source material layer on the surface of the first protective layer 210. A non-adsorbed source gas may be purged. Subsequently, the reaction gas may be supplied into the process chamber to perform the second RF process of reacting the reaction gas with the source material layer. Thereafter, a reaction byproduct and/or an unreacted reaction gas may be purged. The second protective layer 220 may be formed as described above.

A nitrogen content in the second protective layer 220 may be adjusted by adjusting a process time of the second dose process and a process time of the second RF process in the second deposition-cycle. Referring to FIG. 9B, a ratio of the process time of the second RF process RF2 to the process time of the second dose process in each of the second deposition-cycles DC2 may be greater than a ratio of the process time of the first RF process RF1 to the process time of the first dose process DS1 in each of the first deposition-cycles DC1. For example, a process condition may be set such that the process time of the second RF process RF2 is longer than the process time of the second dose process DS2 in each of the second deposition-cycles DC2. The process time of the second RF process RF2 may range from 150% to 500% of the process time of the second dose process DS2. For example, the second dose process DS2 may be performed for about 2 seconds, and then, the second RF process RF2 may be performed for about 6 seconds. In this case, the amount of the source gas adsorbed on the surface of the first protective layer 210 may be reduced, and the amount of the reaction gas reacting with the adsorbed source gas may increase. Thus, the second protective layer 220 may be formed of a nitride layer having a high nitrogen content. In FIG. 9B, the second deposition-cycles DC2 repeatedly performed are performed for the same process time. However, embodiments of the inventive concepts are not limited thereto. In certain embodiments, the second deposition-cycles DC2 may be performed for different process times, and in this case, a ratio of the process time of the second RF process RF2 to the process time of the second dose process DS2 in each of the second deposition-cycles DC2 may be constant. Thus, the second protective layer 220 formed by the second process may have a constant nitrogen content.

Alternatively, the nitrogen content in the second protective layer 220 may be adjusted by adjusting the RF power used in the second RF process. The RF power used in the second RF process may be greater than the RF power used in the first RF process. For example, a process condition may be set such that the RF power used in the second RF process is high. In this case, the amount of the nitrogen plasma formed by the RF power applied to the reaction gas may increase, and thus, the amount of the reaction gas reacting with the adsorbed source gas may increase.

The first process and the second process may be performed in-situ. For example, the first process and the second process may be performed in one process chamber and may be continuously performed. For example, a process condition may be changed in the first process, and thus, the second process may be performed immediately. For example, the second process may be performed by reducing the process time of the dose process and increasing the process time of the RF process in the first process.

According to the embodiments, the second process of forming the second protective layer 220 may be performed by substantially the same method as the first process of forming the first protective layer 210. In other words, the processes of forming the protective layer 200 may be simplified, and the protective layers 210 and 220 having different characteristics (e.g., density) may be easily formed by the simple processes.

In addition, according to the embodiments, the protective layer 200 protecting the memory cells MC may include two protective layers 210 and 220 having different nitrogen contents, and thus, the protective layer 200 may protect the memory cells MC from both damages caused by an internal element of the protective layer 200 and damage caused by an external factor.

In certain embodiments, the protective layer 200 may be formed such that the nitrogen content in the protective layer 200 is continuously changed. The embodiment of FIG. 4B in which the nitrogen content in the protective layer 200' increases as the distance from the sidewall of the memory cell MC increases will be described hereinafter.

In order to form the protective layer 200' illustrated in FIG. 4B, a different process may be performed to form a protective layer of the memory cell MC, that is, the protective layer 200'. In some embodiments, this process may also be performed by an ALD method using a gas (i.e., a source gas) of a source material and a gas (i.e., a reaction gas) of a reaction material. The source gas may include silicon (Si) atoms, and the reaction gas may include nitrogen (N) atoms.

The protective layer 200' may be deposited by a plurality of deposition-cycles. For example, the deposition-cycle may include a dose process, an RF process, and a purging process. In detail, the source gas may be supplied into a process chamber to perform the dose process of adsorbing the source gas on surfaces of the memory cells MC to form a source material layer. A non-adsorbed source gas may be purged. The reaction gas may be supplied into the process chamber to perform the RF process of reacting the reaction gas with the source material layer. Thereafter, a reaction byproduct and/or an unreacted reaction gas may be purged. The deposition-cycle may be repeatedly performed to form the protective layer 200.

A gradient of a nitrogen content in the protective layer 200' may be formed by adjusting a process time of the dose process and a process time of the RF process in the deposition-cycle. Referring to FIG. 9C, a process condition may be set such that the process time of the dose process DS gradually decreases, and the process time of the RF process gradually increases as the deposition-cycle DC is repeatedly performed. Here, the deposition-cycles DC repeatedly performed may be performed for the same time or may be performed for different times. In this case, as the deposition-cycle DC is repeated, the amount of the source gas adsorbed on the surfaces of the memory cells MC may decrease, and the amount of the reaction gas reacting with the adsorbed source gas may increase. Thus, an earlier formed portion of the protective layer 200' (see FIG. 4B) (i.e., a portion of the protective layer 200' adjacent to the memory cells MC) may be formed to have a low nitrogen content, and a later formed portion of the protective layer 200' (i.e., another portion of the protective layer 200' away from the memory cells MC) may be formed to have a high nitrogen content.

Alternatively, the nitrogen content in the protective layer 200' may be adjusted by adjusting RF power used in the RF process. For example, as the deposition-cycle is repeatedly performed, a ratio of the process time of the RF process to the process time of the dose process may be constant but the RF power used in the RF process may increase. In this case, as the deposition-cycle is repeatedly performed, the amount of the nitrogen plasma formed by the RF power applied to the reaction gas may gradually increase, and thus, the amount of the reaction gas reacting with the adsorbed source gas may gradually increase.

The methods of forming the protective layers 200 and 200' by using the ALD method were described above. However, embodiments of the inventive concepts are not limited thereto. The protective layer 200 and 200' of the variable resistance memory device may be formed by at least one of other various methods such as a chemical vapor deposition (CVD) method.

For example, the first process of forming the first protective layer 210 and the second process of forming the second protective layer 220 may be performed by a CVD method using a gas (i.e., a source gas) of a source material and a gas (i.e., a reaction gas) of a reaction material. At this time, a ratio of a concentration of the reaction gas to a concentration of the source gas in the first process may be less than a ratio of a concentration of the reaction gas to a concentration of the source gas in the second process. Thus, the protective layer 200 of FIG. 4A which includes the first protective layer 210 having the low nitrogen content and the second protective layer 220 having the high nitrogen content may be formed.

Meanwhile, the process of forming the protective layer 200' may also be performed by a CVD method using a gas (i.e., a source gas) of the source material and a gas (i.e., a reaction gas) of the reaction material. At this time, a ratio of a concentration of the reaction gas to a concentration of the source gas in the process may gradually increase. Thus, the protective layer 200' (see FIG. 4B) of which the nitrogen content increases as a distance from the memory cell MC increases may be formed.

Figure 8A:
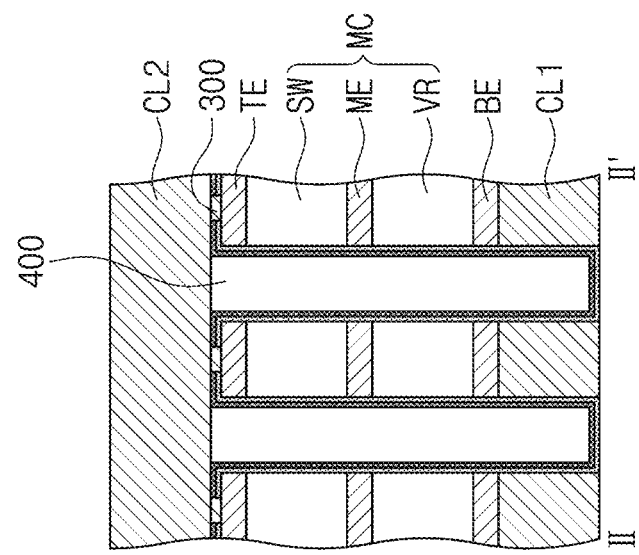
Figure 8B:
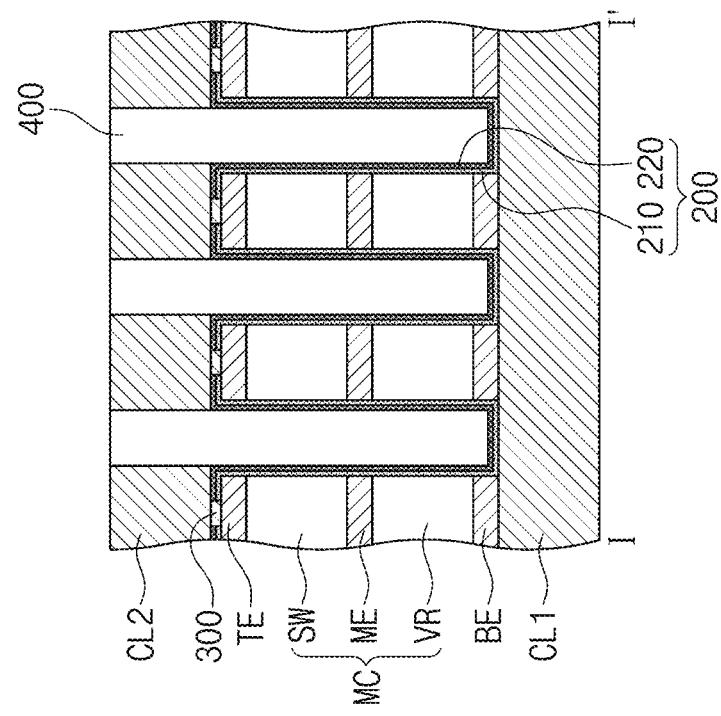

Referring to FIGS. 2 and 3A-3B again and FIGS. 8A-8B, contacts 300 may be formed on the memory cells MC. For example, the protective layer 200 may be etched to form holes exposing portions of top surfaces of the memory cells MC. The contacts 300 may be formed by filling the holes with a conductive material.

An insulating layer 400 may be formed by filling a space between the memory cells MC with an insulating material.

Second conductive lines CL2 may be formed on the memory cells MC. For example, a second conductive layer may be formed on the memory cells MC and the insulating layer 400, and then, the second conductive layer may be patterned to form the second conductive lines CL2 extending in the second direction D2. The second conductive lines CL2 may be electrically connected to the memory cells MC through the contacts 300.

The variable resistance memory device may be manufactured as described above.

Figure 10:
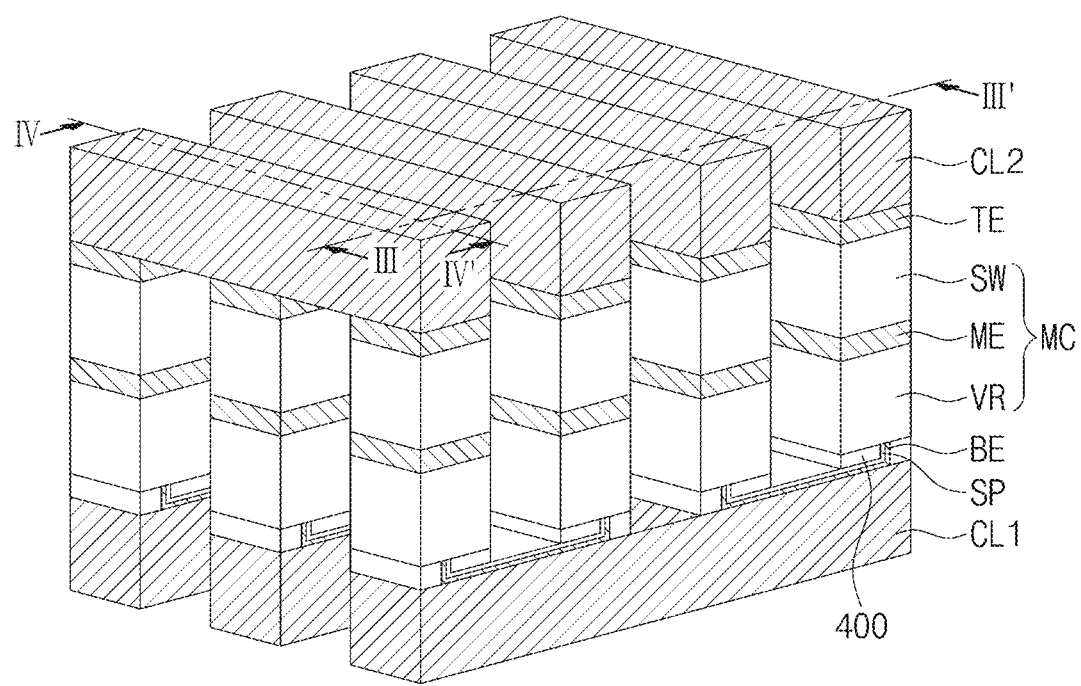
FIG. 10 is a perspective view schematically illustrating a portion of a variable resistance memory device according to some embodiments.
Figure 11A:
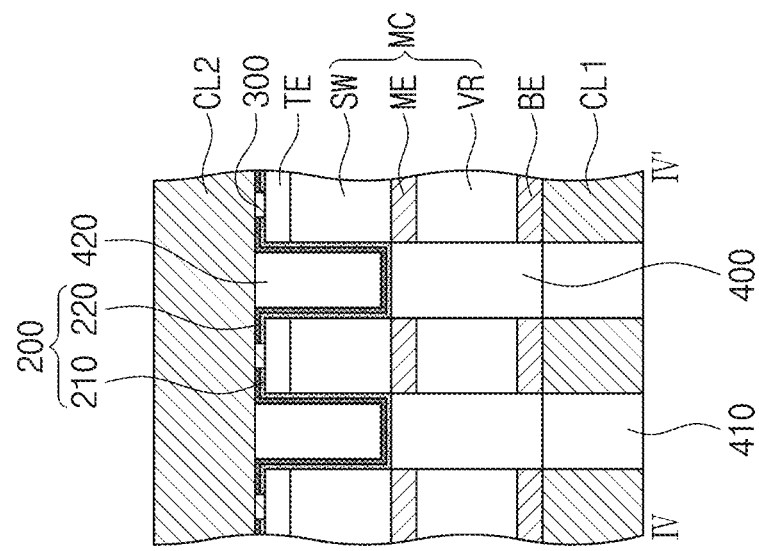
FIGS. 11A-11B are cross-sectional views taken along lines III-III' and IV-IV' of FIG. 7.
Figure 11B:
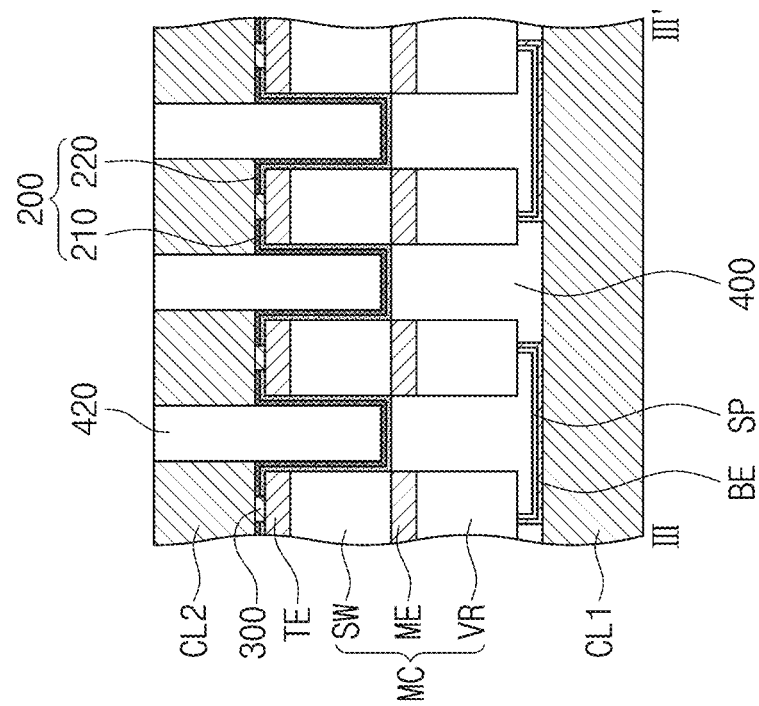
Figure 13A:
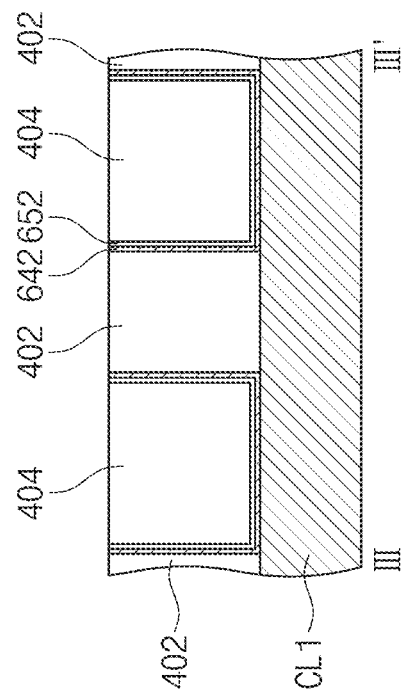
Figure 13B:
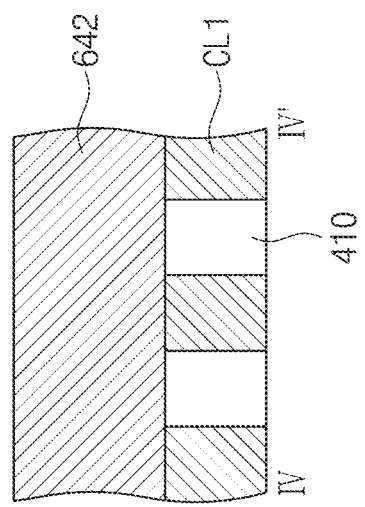
Figures 15A, 15B:
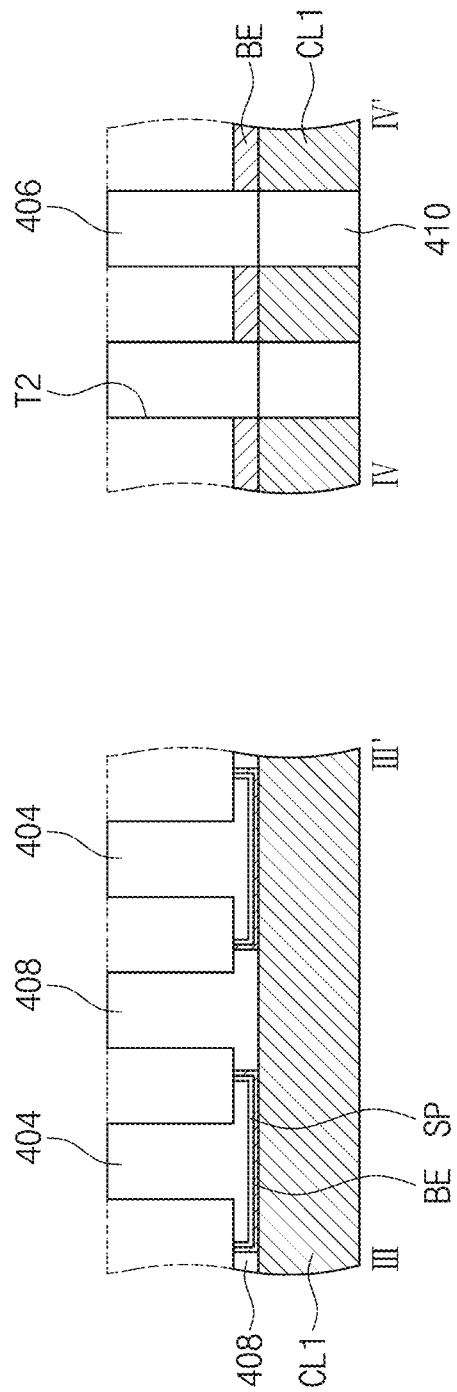
Figure 16A:
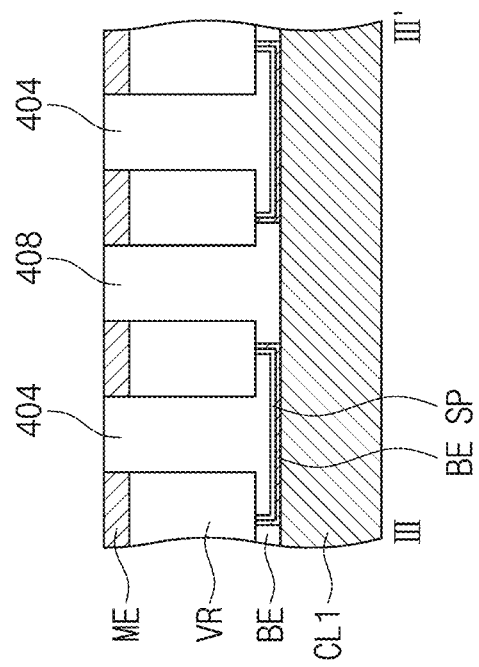
Figure 16B:
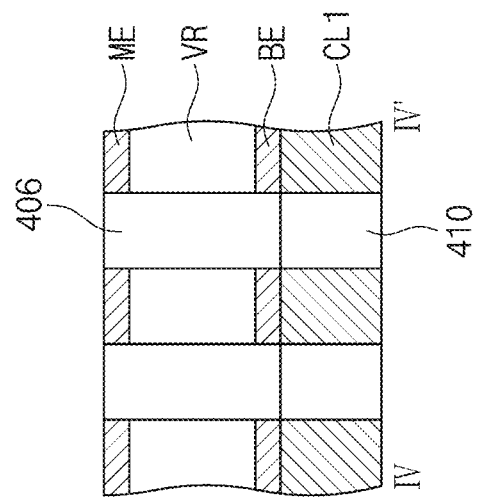
Figure 17A:
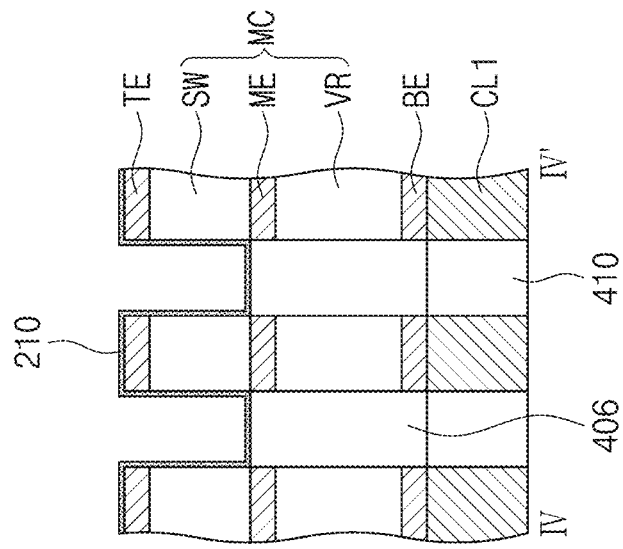
Figure 17B:
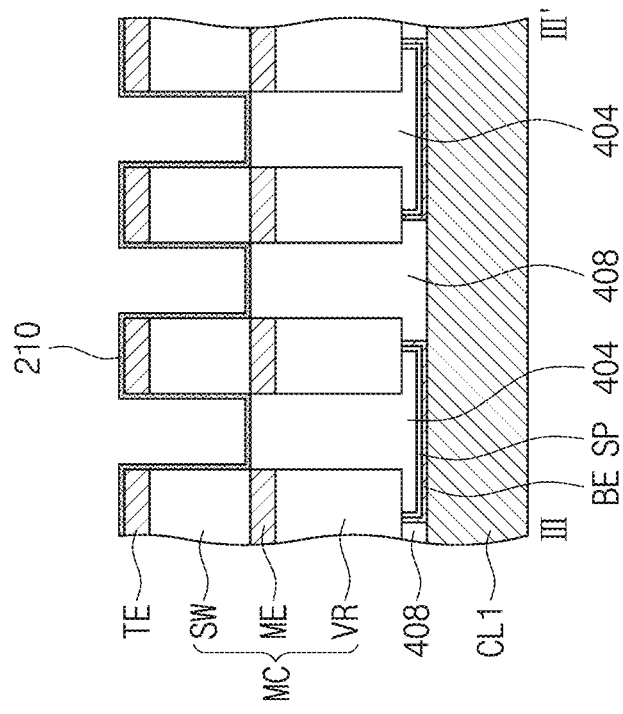
Figure 18A:
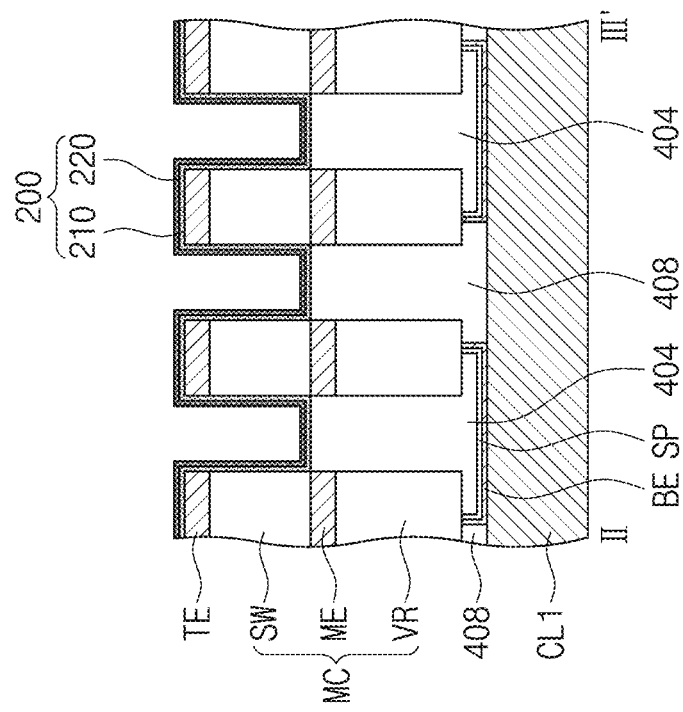
Figure 18B:
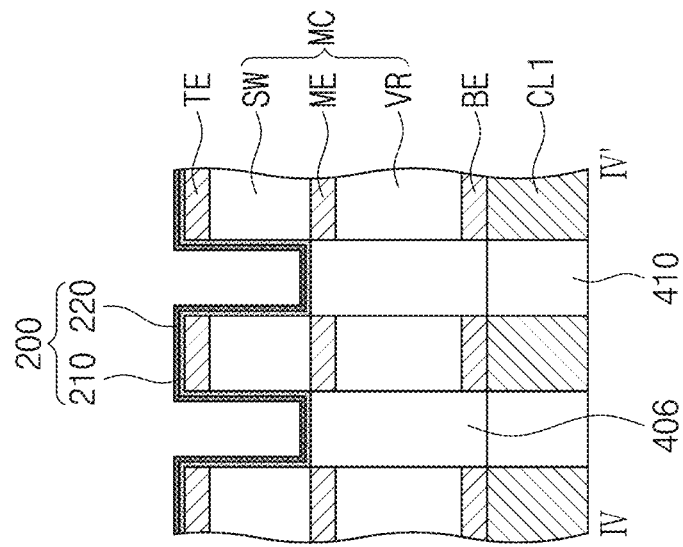
Figure 19A:
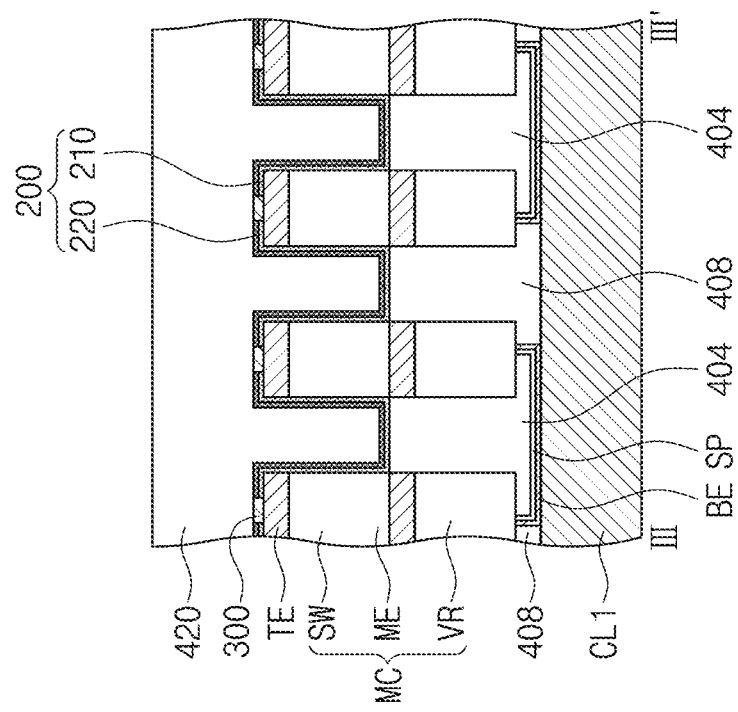
Figure 19B:
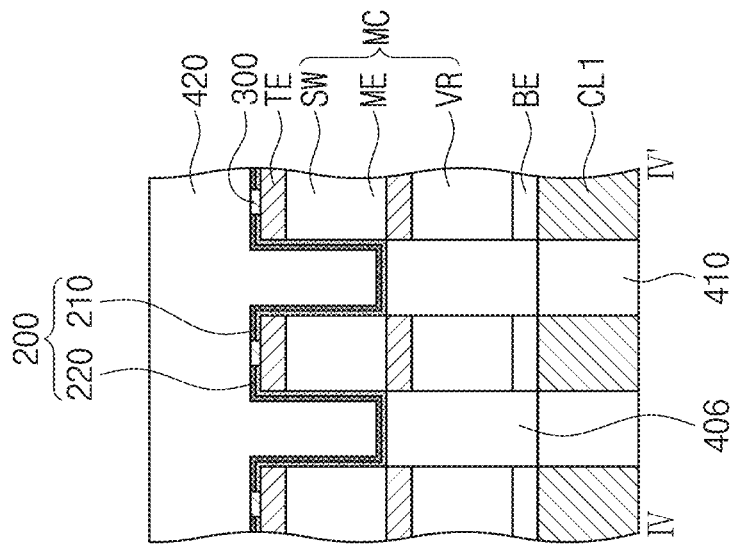
Figure 20A:
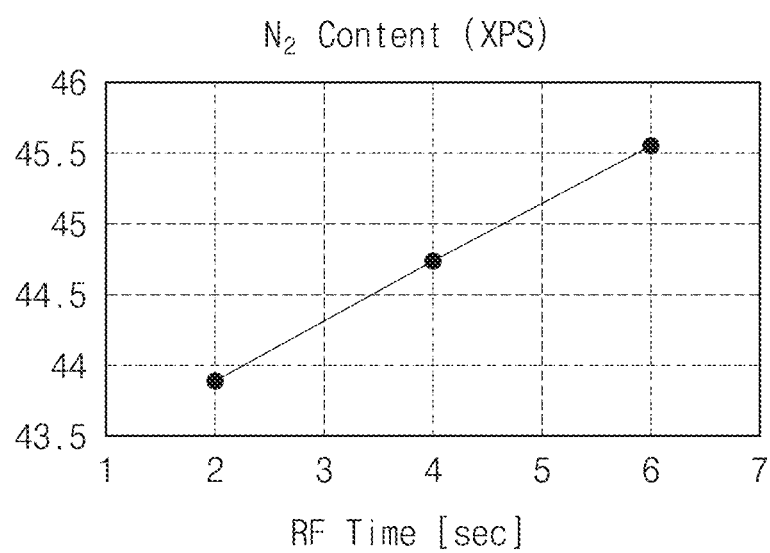
FIGS. 20A to 20C are graphs showing measured results of characteristics of embodiments.
Figure 20B:
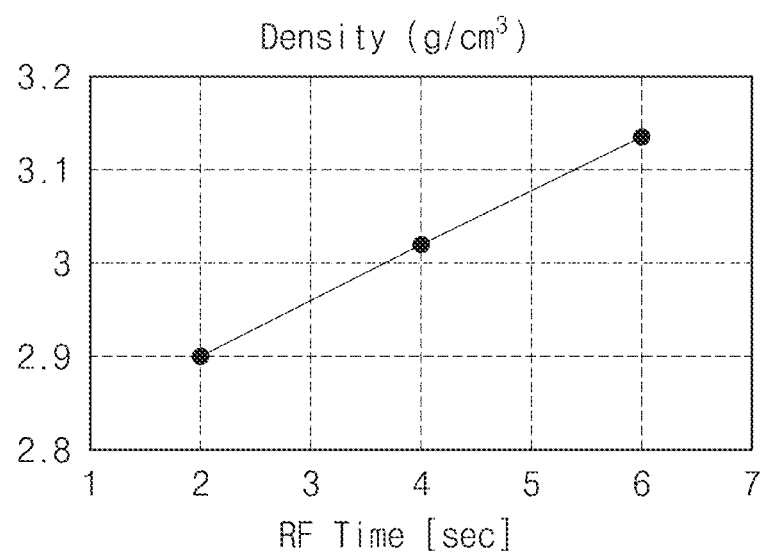
Figure 20C:
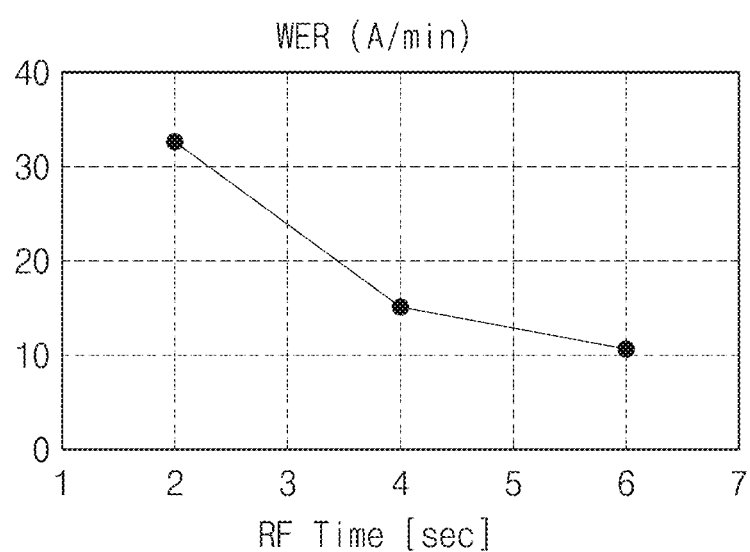

FIG. 10 is a perspective view schematically illustrating a portion of a variable resistance memory device according to some embodiments. FIGS. 11A-11B are cross-sectional views taken along lines III-III' and IV-IV' of FIG. 10, respectively.

First conductive lines CL1 extending in a first direction D1 may be provided on a substrate (not shown, see 100 in FIG. 1). Second conductive lines CL2 extending in a second direction D2 may be provided on the first conductive lines CL1. Spaces between the first conductive lines CL1 may be filled with a first interlayer insulating layer 410.

Memory cells MC may be disposed at intersection points of the first conductive lines CL1 and the second conductive lines CL2, respectively. Each of the memory cells MC may include a variable resistance pattern VR, an intermediate electrode ME and a switching pattern SW, which are connected in series between a corresponding one of the first conductive lines CL1 and a corresponding one of the second conductive lines CL2.

A bottom electrode BE may be provided between the memory cell MC and the first conductive line CL1 corresponding thereto. The memory cells MC may be electrically connected to the first conductive lines CL1 through the bottom electrodes BE. According to the present embodiments, the bottom electrodes BE of a pair of the memory cells MC adjacent to each other in the first direction D1 may be connected to each other. In other words, the pair of memory cells MC may share one bottom electrode BE. In this case, the bottom electrode BE may include vertical portions connected to the pair of memory cells MC, respectively, and a horizontal portion disposed on the substrate (not shown) between the pair of memory cells MC. The horizontal portion of the bottom electrode BE may extend along a top surface of the first conductive line CL1 connected in common to the pair of memory cells MC. The bottom electrode BE may have a U-shape when viewed in a cross-sectional view.

A spacer SP may be provided between the vertical portions of the bottom electrode BE. The spacer SP may be provided on sidewalls, facing each other, of the vertical portions of the bottom electrode BE, and may extend along a top surface of the horizontal portion of the bottom electrode BE. The spacer SP may have a U-shape when viewed in a cross-sectional view. The horizontal portion of the bottom electrode BE may extend between the spacer SP and the top surface of the first conductive line CL1 connected in common to the pair of memory cells MC. The spacer SP may include poly-crystalline silicon or silicon oxide.

Each of top electrodes TE may be disposed between a corresponding one of the memory cells MC and a corresponding one of the second conductive lines CL2 to electrically connect them.

An insulating layer 400 may be provided on the substrate (not shown). The insulating layer 400 may be formed between the variable resistance patterns VR and between the intermediate electrodes ME of the memory cells MC, and may cover the bottom electrodes BE and the spacers SP. The insulating layer 400 may support sidewalls of lower portions of the memory cells MC.

A protective layer 200 may be provided on the insulating layer 400. The protective layer 200 may cover the memory cells MC on the insulating layer 400. For example, the protective layer 200 may be provided along sidewalls of upper portions (e.g., the switching patterns SW) of the memory cells MC, sidewalls of the top electrodes TE, and a top surface of the insulating layer 400. The protective layer 200 may be in contact with the switching pattern SW. The protective layer 200 may include a nitride layer such as silicon nitride ($SiN_x$).

The protective layer 200 may have different nitrogen contents at different positions therein. The nitrogen content in the protective layer 200 may be low near at an interface between the protective layer 200 and the memory cell MC, and may be high near at an outer sidewall of the protective layer 200. The protective layer 200 may include a first protective layer 210 being in contact with the sidewalls of the memory cells MC and a second protective layer 220 formed on the first protective layer 210, as described with reference to FIG. 4A. A nitrogen content of the first protective layer 210 may be less than a nitrogen content of the second protective layer 220. A density of the first protective layer 210 may be less than a density of the second protective layer 220. As described above, the protective layer 200 may include the first protective layer 210 minimizing or preventing damage of the memory cells MC by nitrogen, and the second protective layer 220 minimizing or preventing damage of the memory cells MC by an external factor (e.g., oxygen or moisture). Alternatively, the nitrogen content in a protective layer, that is, the protective layer 200' in FIG. 4B, may increase as a distance from the sidewall of the memory cell MC increases, as described with reference to FIG. 4B. In this case, a density of the protective layer 200 may increase from the interface between the protective layer 200 and the memory cell MC to the outer sidewall of the protective layer 200.

Contacts 300 may be provided on the memory cells MC. The contacts 300 may penetrate the protective layer 200 to electrically connect the top electrodes TE and the second conductive lines CL2.

A second interlayer insulating layer 420 may be provided on the insulating layer 400 and the protective layer 200. The second interlayer insulating layer 420 may cover the switching patterns SW of the memory cells MC and the top electrodes TE. The second conductive lines CL2 may be provided in the second interlayer insulating layer 420. For example, spaces between the second conductive lines CL2 may be filled with the second interlayer insulating layer 420.

FIGS. 12A-12B to 19A-19B are cross-sectional views illustrating a method of manufacturing a variable resistance memory device according to some embodiments.

Referring to FIGS. 10, 11A-11B and 12A-12B, first conductive lines CL1 and a first interlayer insulating layer 410 may be formed on a substrate (not shown). For example, a conductive layer may be deposited on the substrate (not shown), and then, a patterning process may be performed on the conductive layer to form the first conductive lines CL1. An insulating layer covering the first conductive lines CL1 may be formed on the substrate (not shown). A planarization process may be performed on the insulating layer to form the first interlayer insulating layer 410. At this time, top surfaces of the first conductive lines CL1 may be exposed. Alternatively, the first interlayer insulating layer 410 having trenches may be formed on the substrate (not shown), and the first conductive lines CL1 may be formed by filling the trenches with a conductive material.

A first insulating layer 402 may be formed on the first interlayer insulating layer 410. The first insulating layer 402 may have a first trench T1. The first trench T1 may extend in the second direction D2. The first trench T1 may expose portions of the first conductive lines CL1 and portions of the first interlayer insulating layer 410.

A conductive layer 640 and a spacer layer 650 may be sequentially deposited on the substrate (not shown). For example, the conductive layer 640 may be formed to conformally cover an inner sidewall and a bottom surface of the first trench T1 and a top surface of the first insulating layer 402. Thereafter, the spacer layer 650 may be formed to conformally cover a top surface of the conductive layer 640. The conductive layer 640 may include a conductive material. The spacer layer 650 may include an insulating material such as silicon oxide or a conductive material such as poly-silicon. At this time, the spacer layer 650 may have an etch selectivity with respect to the first interlayer insulating layer 410 and the first insulating layer 402.

Referring to FIGS. 10, 11A-11B and 13A-13B, a second insulating pattern 404 may be formed in the first trench T1. In detail, an insulating layer (not shown) may be formed on the spacer layer 650 to fill a remaining region of the first trench T1. Thereafter, a planarization process may be performed on the insulating layer, the spacer layer 650 and the conductive layer 640 until the top surface of the first insulating layer 402 is exposed, thereby forming an electrode pattern 642, a spacer pattern 652, and the second insulating pattern 404 which are sequentially stacked in the first trench T1. The electrode pattern 642, the spacer pattern 652, the first insulating layer 402, and the second insulating pattern 404 may extend in the second direction D2. The second insulating pattern 404 may include an insulating material having an etch selectivity with respect to the spacer pattern 652.

Referring to FIGS. 10, 11A-11B and 14A-14B, the electrode pattern 642, the spacer pattern 652, the second insulating pattern 404, and the first insulating layer 402 may be patterned. For example, mask patterns (not shown) extending in the first direction D1 may be formed on the first insulating layer 402, and the second insulating pattern 404. The electrode pattern 642, the spacer pattern 652, the second insulating pattern 404, and the first insulating layer 402 may be patterned using the mask patterns as an etch mask. Thus, a second trench T2 may be formed on the top surface of the first interlayer insulating layer 410 between the first conductive lines CL1. Bottom electrodes BE, spacers SP, and first insulating patterns 408 may be formed on the first conductive lines CL1 by the patterning process. For example, the electrode pattern 642 may be etched to form the bottom electrodes BE, and the spacer pattern 652 may be etched to form the spacers SP. The first insulating layer 402 may be etched to form the first insulating patterns 408. By the patterning process, the second insulating pattern 404 may be formed into a plurality of patterns separated from each other in the second direction D2. Thereafter, a third insulating pattern 406 may be formed in the second trench T2.

Referring to FIGS. 10, 11A-11B and 15A-15B, upper portions of the bottom electrodes BE and upper portions of the spacers SP may be etched. Thus, top surfaces of the bottom electrodes BE and top surfaces of the spacers SP may be recessed from top surfaces of the first to third insulating patterns 408, 404 and 406, and thus, inner spaces surrounded by the first to third insulating patterns 408, 404 and 406 may be formed on the bottom electrodes BE and the spacers SP. In some embodiments, an etching process for increasing widths of the inner spaces may be performed.

Referring to FIGS. 10, 11A-11B and 16A-16B, a variable resistance pattern VR and an intermediate electrode ME may be sequentially formed in each of the inner spaces. For example, the variable resistance patterns VR may fill lower regions of the inner spaces, respectively. The intermediate electrodes ME may be formed on top surfaces of the variable resistance patterns VR, respectively. The intermediate electrodes ME may be formed to fill remaining regions of the inner spaces, which are not filled with the variable resistance patterns VR.

Referring to FIGS. 10, 11A-11B and 17A-17B, a switching pattern SW and a top electrode TE may be sequentially formed on each of the intermediate electrodes ME. For example, a sacrificial layer may be formed on the first to third insulating patterns 408, 404 and 406. The sacrificial layer may have holes exposing top surfaces of the intermediate electrodes ME, respectively. The switching pattern SW and the top electrode TE may be sequentially formed in each of the holes. The switching pattern SW may fill a lower region of each of the holes, and the top electrode TE may be formed on a top surface of the switching pattern SW to fill an upper region of each of the holes. Thereafter, the sacrificial layer may be removed. Thus, memory cells MC, each of which includes the variable resistance pattern VR, the intermediate electrode ME, and the switching pattern SW, may be formed.

A first protective layer 210 may be formed on the first to third insulating patterns 408, 404 and 406. The first protective layer 210 may be formed to cover portions of sidewalls of the memory cells MC (in particular, sidewalls of the switching patterns SW). The process of forming the first protective layer 210 may be the same or similar as described with reference to FIGS. 2, 3A-3B and 6A-6B. For example, a first process of forming the first protective layer 210 may be performed by an ALD method using a gas (i.e., a source gas) of a source material and a gas (i.e., a reaction gas) of a reaction material. The first protective layer 210 may be deposited by at least one the first deposition-cycle. The first deposition-cycle may include a first dose process, a first RF process, and a purging process.

Referring to FIGS. 10, 11A-11B and 18A-18B, a second protective layer 220 may be formed on the first protective layer 210. A process of forming the second protective layer 220 may be the same or similar as described with reference to FIGS. 2, 3A-3B and 7A-7B. For example, a second process of forming the second protective layer 220 may also be performed by an ALD method using a gas (i.e., a source gas) of a source material and a gas (i.e., a reaction gas) of a reaction material. The second protective layer 220 may be deposited by at least one the second deposition-cycle. The second deposition-cycle may include a second dose process, a second RF process, and a purging process. A nitrogen content of the second protective layer 220 may be higher than a nitrogen content of the first protective layer 210. For example, a process time of the second RF process of the second process may be longer than a process time of the first RF process of the first process.

Referring to FIGS. 10, 11A-11B and 19A-19B, contacts 300 may be formed on the memory cells MC. For example, the protective layer 200 may be etched to form holes exposing portions of top surfaces of the memory cells MC. The contacts 300 may be formed by filling the holes with a conductive material.

A second interlayer insulating layer 420 may be formed on the protective layer 200 and the first to third insulating patterns 408, 404 and 406. The second interlayer insulating layer 420 may fill a space between the switching patterns SW. The second interlayer insulating layer 420 may cover the memory cells MC.

Referring again to FIGS. 10 and 11A-11B, second conductive lines CL2 may be formed on the memory cells MC. For example, the second interlayer insulating layer 420 may be patterned to form holes extending in the second direction D2. The holes may expose top surfaces of the contacts 300. The second conductive lines CL2 may be formed by filling the holes with a conductive material. The variable resistance memory device may be manufactured as described above.

Embodiment 1

The semiconductor device of FIGS. 3A-3B and 4A was manufactured. In detail, a protective layer was deposited on surfaces of memory cells. The protective layer was deposited by an ALD method. Here, the protective layer was formed by repeatedly performing a deposition-cycle including a dose process of forming a source material layer on the surfaces of the memory cells and a RF process of reacting a reaction gas with the source material layer. In each of the deposition-cycles, the dose process was performed for 2 seconds and the RF process was performed for 2 seconds.

Embodiment 2

Except for a process time of the RF process, other conditions of the embodiment 2 were substantially the same as corresponding conditions of the embodiment 1. In the embodiment 2, the dose process was performed for 2 seconds and the RF process was performed for 4 seconds in each of the deposition-cycles.

Embodiment 3

Except for a process time of the RF process, other conditions of the embodiment 3 were substantially the same as corresponding conditions of the embodiment 1. In the embodiment 3, the dose process was performed for 2 seconds and the RF process was performed for 6 seconds in each of the deposition-cycles.

Various experiments for measuring characteristics of the protective layers of the embodiments 1 to 3 were performed. FIGS. 10A to 10C are graphs showing measured results of characteristics of embodiments.

FIG. 10A shows results of measuring nitrogen contents in the protective layers of Embodiments 1 to 3. As shown in FIG. 10A, the nitrogen content in the protective layer of Embodiment 1 is the lowest, and the nitrogen content in the protective layer of Embodiment 3 is the highest. In other words, the protective layer having a low or high nitrogen content may be formed by changing a process condition in the process of forming the protective layer. According to the embodiments, the first protective layer and the second protective layer may be formed through substantially the same process. The first protective layer may be formed as described in Embodiment 1, and thus, the first protective layer may have the low nitrogen content. The second protective layer may be formed as described in Embodiment 3, and thus, the second protective layer may have the high nitrogen content.

As the results of FIG. 10A, in the variable resistance memory device according to the embodiments, the first protective layer adjacent to the memory cells may have the low nitrogen content to inhibit nitrification reaction of the memory cells.

FIG. 10B shows results of measuring densities of the protective layers of Embodiments 1 to 3. As shown in FIG. 10B, the density of the protective layer of Embodiment 1 is the lowest, and the density of the protective layer of Embodiment 3 is the highest.

FIG. 10C shows results of measuring wet etch rates of Embodiments 1 to 3. As shown in FIG. 10C, the wet etch rate of the protective layer of Embodiment 1 is the highest, and the wet etch rate of the protective layer of Embodiment 3 is the lowest.

In other words, it may be recognized that the density of the protective layer increases as the nitrogen content in the protective layer increases. According to the embodiments, the second protective layer may be formed as Embodiment 3 to have the high nitrogen content, and thus, the density of the second protective layer may be high.

As the results of FIGS. 10A to 10C, the second protective layer according to the embodiments may have the high nitrogen content to have the high density, and thus, the second protective layer may protect the memory cells from external factors (e.g., oxygen, moisture, light, and/or an etching solution).

In the variable resistance memory device according to the embodiments, the protective layer may have the low nitrogen content near the memory cells, and thus, damage of the memory cells by nitrogen may be minimized or prevented. In addition, the density of the outer portion of the protective layer may be high by the high nitrogen content, and thus, the protective layer may inhibit or prevent the memory cells from being damaged by permeation of external oxygen or moisture and may protect the memory cells from an external impact.

According to the embodiments, the method of manufacturing the variable resistance memory device may inhibit the memory cells from being damaged by nitrogen plasma in the RF process when the first protective layer is formed. In addition, the processes may be simplified, and the first and second protective layers having different characteristics (e.g., different densities) may be easily formed using the simple processes.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A variable resistance memory device comprising:
   a first conductive line provided on a substrate;
   a second conductive line intersecting the first conductive line on the first conductive line;
   a memory cell comprising a variable resistance pattern and provided at an intersection point of the first conductive line and the second conductive line; and
   a protective layer sealing the memory cell on the substrate and comprising silicon nitride (SiNx),
   wherein a nitrogen content in the protective layer increases as a distance from an interface between the protective layer and the memory cell increases, and
   wherein the nitrogen content in the protective layer continuously changes as the distance from the interface between the protective layer and the memory cell.

2. The variable resistance memory device of claim 1, wherein a density of the protective layer increases as the distance from the interface between the protective layer and the memory cell increases.

3. The variable resistance memory device of claim 1, wherein the protective layer comprises undoped silicon nitride (undoped-SiNx).

4. The variable resistance memory device of claim 1, wherein the protective layer is in contact with a sidewall of the memory cell.

5. The variable resistance memory device of claim 1, wherein the memory cell further comprises a switching pattern, and
   wherein the variable resistance pattern and the switching pattern are connected in series to each other.

6. The variable resistance memory device of claim 1, further comprising a contact penetrating the protective layer to connect the memory cell and the second conductive line.

7. The variable resistance memory device of claim 1, wherein the nitrogen content in the protective layer continuously changes as the distance from the interface between the protective layer and the memory cell.

8. The variable resistance memory device of claim 1, the protective layer comprising:
   a first protective layer covering at least a portion of the memory cell; and
   a second protective layer formed on the first protective layer,
   wherein a nitrogen content in the first protective layer is less than a nitrogen content in the second protective layer.

9. The variable resistance memory device of claim 8, wherein the first protective layer is provided along a surface of the variable resistance pattern, and
   wherein the second protective layer is spaced apart from the variable resistance pattern by the first protective layer.

10. The variable resistance memory device of claim 1, further comprising an insulating layer covering the variable resistance pattern disposed in a lower portion of the memory cell,
    wherein the protective layer covers a sidewall of an upper portion of the memory cell and a top surface of the insulating layer.

11. The variable resistance memory device of claim 1, wherein the protective layer is interposed between the variable resistance pattern and the second conductive line.

12. The variable resistance memory device of claim 1, further comprising a top electrode on the variable resistance pattern,
wherein the protective layer is disposed on side surfaces of the top electrode between the variable resistance pattern and the second conductive line.

* * * * *